US006833087B2

(12) United States Patent
Beck et al.

(10) Patent No.: US 6,833,087 B2
(45) Date of Patent: Dec. 21, 2004

(54) 2,4,-HEXADIENOIC ACID, ITS ALKALI SALTS AND/OR DERIVATIVES FOR PREVENTING OXIDATIVE CORROSION OF METALS

(75) Inventors: Robert A. Beck, Framingham, MA (US); Paul D. Manos, Pinehurst, NC (US)

(73) Assignees: Wonders of Water, LLC, Aberdeen, NC (US); Intellectual Concepts, LLC, Lake Charles, LA (US)

( * ) Notice: Subject to any disclaimer, the term of this patent is extended or adjusted under 35 U.S.C. 154(b) by 29 days.

(21) Appl. No.: 10/055,799

(22) Filed: Oct. 25, 2001

(65) Prior Publication Data

US 2003/0041929 A1 Mar. 6, 2003

(Under 37 CFR 1.47)

Related U.S. Application Data

(60) Provisional application No. 60/243,943, filed on Oct. 27, 2000.

(51) Int. Cl.[7] ............................................. C09K 3/00
(52) U.S. Cl. .......................... 252/389.1; 252/389.61; 252/396; 252/397; 252/399; 252/400.1; 252/400.61; 252/407
(58) Field of Search ..................... 252/388, 389.1, 252/389.61, 396, 397, 399, 400.1, 400.61, 407

(56) References Cited

U.S. PATENT DOCUMENTS

| | | | |
|---|---|---|---|
| 3,987,208 A | 10/1976 | Rahman et al. ............. 426/326 |
| 4,120,996 A | 10/1978 | Castellucci ................. 427/318 |
| 4,374,174 A | 2/1983 | Stricklin et al. ............. 428/341 |
| 4,592,915 A * | 6/1986 | Goyette et al. .............. 426/321 |
| 4,676,834 A | 6/1987 | Treybig .................... 106/14.15 |
| 4,734,259 A | 3/1988 | Frenier ........................ 422/16 |
| 5,674,428 A | 10/1997 | Lott et al. ...................... 252/70 |
| 5,869,552 A | 2/1999 | Pederson et al. ........... 523/413 |
| 5,922,817 A | 7/1999 | Pederson et al. ........... 525/531 |
| 6,027,687 A * | 2/2000 | Nakajima et al. ............. 422/13 |
| 6,500,360 B2 * | 12/2002 | Bendier ................. 252/389.62 |

* cited by examiner

Primary Examiner—Cephia D. Toomer
(74) Attorney, Agent, or Firm—Weingarten, Schurgin, Gagnebin & Lebovici LLP

(57) ABSTRACT

Compositions and methods are disclosed for preventing the oxidative corrosion of metal surfaces by exposing a metal surface to an anti-corrosion agent characterized as 2,4-trans, trans-hexadienoic acid (2,4-HDA), its alkali salt identified as potassium sorbate (KHDA), or other derivatives that conserve or embody the 2,4-trans, trans-hexadiene-type moiety present in their molecular structures as an active anti-corrosion agent (ACA), in combination with a material capable of forming a moisture retentive barrier over the metal surface.

The compositions and methods of the invention provide a practical, non-toxic way of ensuring anti-corrosion protection for metals, or devices containing exposed metals, stored or operated in water or in the presence of water vapor. Exemplary, non-exhaustive uses of the invention include employing the composition as a lubricant for the surface of a metal or as a pump oil or brake fluid; using the composition as an undercoating for painting, electro-plating or electro-polishing procedures; and providing a protective coating for any metal or metal-containing machine or device, from automotive assembly plant metal press machines to electronic circuit boards.

36 Claims, No Drawings

2,4,-HEXADIENOIC ACID, ITS ALKALI SALTS AND/OR DERIVATIVES FOR PREVENTING OXIDATIVE CORROSION OF METALS

CROSS REFERENCE TO RELATED APPLICATIONS

This application claims the priority of U.S. Provisional Application No. 60/243,943 filed Oct. 27, 2000 entitled, 2,4-HEXADIENOIC ACID, ITS ALKALI SALTS AND/OR DERIVATIVES FOR PREVENTING WATER-MEDIATED OXIDATIVE CORROSION OF METALS, the whole of which is hereby incorporated by reference herein.

STATEMENT REGARDING FEDERALLY SPONSORED RESEARCH OR DEVELOPMENT

NONE

BACKGROUND OF THE INVENTION

Corrosion is a serious problem that affects and undermines the quality of everyday social life and the endurance of industrial products. Extensive efforts have been undertaken to design and fabricate products such as steam generators, heat exchangers, bridges, oil drilling platforms and motor vehicles that can resist the destructive effects of corrosion. For many traditional products, however, corrosion continues to be a serious destructive problem. In addition to traditional products, new developments in energy sources, advances in material sciences, microprocessing technology and miniaturization of new devices to the micron scale all reassert the demands for effective anti-corrosion technologies that avert device failures.

Corrosion is typically understood as an electrochemical reaction that involves loss of electrons from metals, a reaction more generally described as oxidation. The definition of oxidation in electrochemical terms is independent of whether or not oxygen is present when the process of electron loss from a metal occurs. The loss of one or more electrons from a metal requires the acquisition of the electron(s) by another agent. Thus, the metal that serves as an electron donor in this case is termed a reducing agent, while the electron acceptor serves as an oxidizing agent. One practical example illustrating such an electrochemical event typically involves metallic iron. Electrons lost from an iron atom (reducing agent) can be acquired by oxygen (oxidizing agent) to produce a new combined iron and oxygen derivative identified as iron oxide, or rust, which is an inorganic, low density (flaky) product commonly associated with metal corrosion. Although oxygen is used as a model of iron oxidation in this case, the same oxidizing agent effect could be demonstrated by sulfur and the resulting product could have been iron sulfide instead of iron oxide.

Apart from rust involving metal corrosion, the formation of scale presents another illustrative model tied to principles of oxidation. Scale is defined as a thin coating, layer or encrustation of material that is rich in complex oxides of sulfur, magnesium and/or calcium. These and other insoluble materials are typically developed and observed as mineral deposits on the inside diameters of pipes, chambers or containment vessels when water plus its dissolved constituents. or solutes, are heated in the process of making hot water.

The transfer of electrons between oxidizing agents and reducing agents cannot occur without the presence of an electrically conductive medium. Water typically serves as the electrically conductive universal solvent medium that supports metal oxidation, consequential corrosion and rusting as well as scale formation in the foregoing models.

Efforts to halt water-mediated metal oxidation and corrosion typically rely on superficial passivation of the metal with toxic materials such as chromic acid, sacrificial coatings (e.g., zinc or galvanized coatings), electroplated metals, polymeric coatings or related efforts that produce a protective barrier between the reactive metal surface and water. Implementation of such strategies usually produces an inflexible anti-corrosion barrier on metal surfaces, and once applied, its removal may be difficult or impossible. For those situations where micro-mechanical or circuit-based devices display corrosion tendencies, aggressive industrial anti-corrosion methods may be totally unsuitable and physically damaging. Thus, there is a significant need for new, simple-to-execute anti-corrosion barrier possibilities.

BRIEF SUMMARY OF THE INVENTION

The invention described herein is directed to preventing the oxidative corrosion of metal surfaces. The invention relies on the exposure of a metal surface to an anti-corrosion agent characterized as 2,4-trans, trans-hexadienoic acid (2,4-HDA), its alkali salt identified as potassium sorbate (KHDA), or other derivatives that conserve or embody the 2,4-trans, trans-hexadiene-type moiety present in their molecular structures, as an active anti-corrosion agent (ACA) in combination with a material, as hereinafter defined, capable of forming a moisture retentive barrier on the surface of the metal. In certain applications, the anti-corrosion agent alone is sufficient to achieve the desired anti-corrosive effect.

In preferred embodiments, the material capable of forming a moisture retentive barrier film over a surface of the metal is selected from the group consisting of a polar liquid, a non-polar liquid, a viscous material, an organic liquid, a polymeric material and a petroleum-based substance; and the composition further comprises any one of a polar liquid, a non-polar liquid, a surfactant, an antioxidant, an organic liquid, a polymeric material, a petroleum-based substance, a buffering material, or graphite or particulate carbon in a suspension. The anti-corrosion agent in the composition of the invention may be packaged for delayed release, e.g., by encapsulation. Preferably, the anti-corrosion agent is present in the composition at a concentration of between 0.2 and 58 percent by weight. Most preferably, the composition is first prepared in concentrated form and then diluted prior to use. The anti-corrosion agent spontaneously adsorbs or chelates to metal surfaces from water solutions so as to produce an organometallic barrier coating. In addition, the residual anti-corrosion agent, after having had an opportunity to adsorb to the metal surface, remains as an aqueous solution where it effectively alters the normal dielectric properties of available water that could contribute to the water's ordinary corrosion properties.

The compositions and methods of the invention provide a practical, non-toxic way of ensuring anti-corrosion protection for metals, or devices containing exposed metals, stored or operated in water or in the presence of water vapor. Exemplary, non-inclusive uses include employing the composition as a lubricant for the surface of a metal or as a pump oil or brake fluid; using the composition as an undercoating for painting, electro-plating or electro-polishing procedures; and providing a protective coating for any metal or metal-containing machine or device, from automotive assembly plant metal press machines to electronic circuit boards.

DETAILED DESCRIPTION OF THE INVENTION

The present invention is directed to the use of 2,4-trans, trans-hexadienoic acid (HDA or sorbic acid), KHDA (a potassium salt of sorbic acid), or their derivatives that structurally conserve the characteristic 2,4-trans, trans-diene moiety as an active anti-corrosion agent (ACA), in combination with a material, as hereinafter defined, chosen, e.g., for its low dielectric constant (D-value) and/or for its lubrication properties and capable of forming a moisture retentive barrier to provide anti-corrosion protection for metal surfaces. In certain applications, e.g., if the protected metal object remains immersed in a KHDA solution, the anti-corrosion agent alone is sufficient to achieve the desired anti-corrosive effect. However, most preferably, the anti-corrosion agent is used in combination with a material capable of forming a moisture retentive barrier on the surface of the article to be protected. This composition not only achieves superior results during immersion but also permits the protected article to be dried and to still retain long term anti-corrosion protection.

The invention disclosed here provides a practical, non-toxic method that ensures anti-corrosion protection for metals, or devices containing exposed metals, stored or operated in water or in the presence of water vapor. Preparations of 2,4-trans, trans-hexadienoic acid (HDA) present as its potassium salt (KHDA), hereinafter designated as the active anti-corrosion agent (ACA), will inhibit the corrosion of metals for indefinite periods of time in a variety of venues as hereinafter described, e.g., while the metals remain immersed in a KHDA-solution, following coating with KHDA in combination with other viscous agents or otherwise jacketed in KHDA by a moisture retentive barrier.

KHDA, as the potassium salt of HDA, dissociates in water to give the 2,4-trans, trans-hexadienoic anion plus a stoichiometrically molar equivalent concentration of potassium ions. The anion provided by the dissociation of KHDA in water is equivalent in structure and function to the anion produced upon the ionization of HDA in water according to principles of weak acid behavior as dictated by its ionization constant ($K_{eq}$). Although the method of the invention may be implemented by dissolving KHDA in water as an expeditious route for providing the ACA activity, Ache functional ACA activity is due to the 2,4-trans, trans-hexadienoic anion. Thus, any substance that directly or indirectly yields this functional anion or provides for its time-released potential availability to any system that contains or might acquire water is considered to be a functional 2,4-trans, trans-hexadiene moiety of the invention and will have equivalent anti-corrosion consequences. This includes the possible embodiment of the anion or its equivalent as (1) a covalently bonded moiety to any other single molecule; (2) a hydrolyzable acyl-ester of mono- or polyhydroxy alcohols as well as aldose and ketose sugars, their monosaccharidic acid equivalents and their polymers; (3) a hydrolyzable acyl-ester of a synthetic polymer or (4) as a hydrolyzable or nonhydrolyzable substituent of simple, complex or derived lipids. Structural modifications of the 2,4-trans, trans-hexadienoic acid where the carboxyl group (—COOH) is substituted or replaced by any other acidic groups, such as (—$SO_3H_2$) or (—$PO_3H_2$) but not to the exclusion of others, are also considered under the functional aegis of a 2,4-trans, trans-hexadienoic anion.

In addition to the use of a separate moisture retentive barrier, the KHDA-metal surface interaction can be ensured by incorporating the ACA into coatings such as those modeled by high viscosity water-soluble non-ionic barrier coatings applied by immersion (dipping) or spraying. While ensuring ACA contact and effectiveness over the surface of a metal, such barriers can be effectively removed by water when necessary, the unoxidized and uncorroded metal surface may be dried, and then further processed as desired. In other applications, for example, direct current may be applied surrounding the ACA-coated metal to produce a directed walk of the ACA away from the metal thereby leaving its surface relatively unprotected to corrosion.

A metal surface coated with an anti-corrosive barrier according to the invention is an excellent candidate for further coating, e.g., by painting or plating over, using fewer steps than are required with prior art processes, as shown in Example IX. In addition, less of the coating/plating material is required than with prior art methods to achieve a stronger, longer lasting barrier finish with no oxidation Furthermore, the coating material is less brittle when applied over an undercoating according to the invention. The composition of the invention may also be mixed into, e.g., a paint or epoxy material, which is then applied as desired, and the resulting coating is more pliable.

In place of water, solvents compatible with the dissolution of either or both the ACA or the chemically unrelated barrier coating can be used to rinse the substances from a treated metal surface. Such solvents could include organics, organic-water combinations with or without pH adjusted and ionic strength regulated buffer solutions.

The metal anti-corrosion protection mechanism for KHDA involves two uniquely independent effects that collaterally support the demonstrated anti-corrosion phenomenon. First, the ACA spontaneously adsorbs or chelates to metal surfaces from water solutions so as to produce an organometallic barrier. Secondly, the residual ACA in solution, after having had an opportunity to adsorb to the metal surface, remains as an aqueous solution where it effectively alters the normal dielectric properties of available water that could contribute to its ordinary corrosion properties. The molecular nature of the ACA is inherently responsible for these two effects, and neither of these effects can be made separable from the other as long as the molecule remains intact.

KHDA thus separates the metal surface from the water and blocks its contact with substances in solution that will promote surface metal oxidation and ensure evidence of corrosion. Compounds ordinarily implicated in corrosive mechanisms involve Group VIA elements of the Periodic Table, but not to the exclusion of others. Metal oxidation and corrosion rely on water-mediated electron transport plus oxidizing and reducing agent interactions. In the method of the invention, the required participation of water for electron transport does not occur. Accordingly, electron transfers mediated by water between materials with galvanically driven electrochemical potential differences can also be minimized.

Water effectively mediates electron flow between oxidizing and reducing agent (redox) pairs because it demonstrates a naturally occurring high dielectric constant (D) of 78.5. While not being bound by any theory, it appears that the demonstrated dielectric property of water is so affected by addition of the anti-corrosion agent of the invention that electrical devices protected according to the method of the invention can continue to be operated by alternating currents while the circuitry is immersed in water. Whether such a demonstration of lowered conductivity is applied to allowing a light bulb to luminesce with 110 volt alternating current supplied by uninsulated copper wires under water, or to reducing the electrochemical flux of electrons accountable for metal corrosion, the performance of the anti-corrosion agent of the invention is clear, defined and repeatable.

The decisive establishment of minimal effective ACA solution concentrations that will protect metals from surface corrosion is a common consideration. Although solutions of the ACA up to 58 percent by weight in water may allow indefinite metal resistance to oxidation and corrosion, much lower concentrations can be used in practice of the invention. Not being bound by any theory, the minimal effective concentration of the ACA that is necessary to protect a specific metal surface from corrosion can be determined by:

1) Whatever concentration of the ACA adequately produces an organometallic surface barrier over the metal; or
2) How much residual ACA must remain in solution to ensure that a zero electrical potential exists between the adsorbed organometallic barrier over the metal surface, as well as the molecular organometallic barrier and the surrounding aqueous phase.

Depending on the ionic strength ($\mu$) or ion concentration (s) in the surrounding water, including divalent and trivalent metal cations, and the unique electrochemical potential over the surface of a metal, effective ACA concentrations can be customized to meet anti-corrosion performance demands. ACA concentrations in water may range, e.g., from 0.2 to 58 percent by weight depending on where a zero electrochemical potential effect is met between the metal surface and the potentially conductive liquid phase.

One simple method for assessing the adequacy and sufficiency of ACA concentrations, embodied as KHDA, that will effectively control metal oxidation and corrosion in a specific case is described in Example II. In summary, however, a discretionary test matrix of up to 30 aqueous solutions can be prepared, each of which is formulated to produce a solution documented in terms of its specific conductivity (measured in microsiemens ($\mu$S)). Where necessary, elementally pedigreed metals designed for anti-corrosion protection are immersed as test specimens in the respective solutions of known specific conductivity. Following two to four weeks of immersion using a desired metal contact temperature, the pedigreed metal samples can be examined for evidence of corrosion using microscopic methods or energy dispersive X-ray analysis.

In the case of energy dispersive X-ray analysis, elemental evidence of oxygen reaction with the surface of the metal is indicative of insufficient ACA effectiveness. Based on the graduated specific conductivity test matrix, some level of specific conductivity will be obvious as a key point above which metal corrosion does not occur. Furthermore, this conductivity will correspond to some minimally effective concentration of a KHDA-based solution that exerts a similar anti-corrosion effect.

The use of any additional ACA concentration beyond that which produces anti-corrosion effects serves only to ensure the functional longevity of the ACA in solution. Once a metal surface, e.g., iron or aluminum, interacts with the ACA, a level of anti-corrosion protection against water vapor and humidity driven corrosion effects is demonstrated. The development and performance of an anti-corrosion barrier effect due to the ACA is described in Example V. Here it has been shown that ferrous metal fibers incorporated into an aqueous plaster-of-Paris formulation (POPF) readily undergo corrosion and rusting during the course of plaster hardening and curing. The use of the aqueous ACA formulation in an identical aqueous plaster formulation, however, halts iron fiber corrosion, rusting and evidence of iron oxide migration through the cured plaster product. The effect of the ACA on the metal fibers persists as a protective anti-corrosion barrier over the iron fibers long after the plaster has cured. Whereas the dry, cured, fiber-impregnated plaster without ACA use shows signs of continued corrosion at relative humidities up to 90 percent, the ACA treated fibers remain shiny and free of rust. This observation further attests to the fact that the ACA appears to work in conjunction with other agents, e.g., in this case, the binding and adhesive agents in the plaster, to form a protective film that may now be dried.

Owing to cost and availability, water is the preferred polar solvent medium for preparing the composition of the invention, when the composition includes those moisture retentive barrier materials miscible with water. Purified, distilled, deionized water at 0.1 $\mu$S or tap water can function equally well as aqueous solvents depending on the anti-corrosion applications. The ACA, embodied as KHDA, may also be admixed, colloidally suspended, or homogenized to a size of less than or equal to 2 microns in liquids that may or may not already contain some water but that also display dielectric properties (D-values) substantially lower than that of water alone.

Furthermore, colloid milling or homogenization of the ACA into selected low dielectric solvents will permit formulation of soluble, emulsifiable or colloidal concentrates that can be diluted on demand to meet protective metal anti-corrosion requirements. These products have the consistency of greases or petroleum jelly. Similar embodiments of the ACA can be incorporated within fluids that are designed and engineered to have predictable shear rates and shear stresses. These include non-Newtonian fluids that have Bingham plastic, pseudoplastic, dilatant, thixotropic and rheopexic flow properties as well as systems that exhibit Newtonian behavior.

Alternatively, the ACA may be colloidally stabilized or homogenized, with or without the assistance of surfactants or suspendable solids, into nonpolar liquids such as oils or nonpolar esters of any desirable melting point or description that display high or low D-values. Applications for such an embodiment of the invention are designed to counter the water-mediated corrosive oxidation effects incumbent with fugitive water droplets, condensation or contamination in oils, which mediate the oxidative destruction of engineered metal surfaces. Typical among these applications are those where dielectric transformer or pump oils may be used. The natural water solubility of the ACA ensures that any fugitive water in oils designed and used for their low D-values and/or lubrication will be preempted from having their operative D-values and lubrication properties altered by an unavoidable acquisitions of water As indicated, water may serve as a singular solvent to demonstrate the favorable anti-corrosion effect of KHDA on metal surfaces, but a variety of water miscible organic solvents with D-values less than that of water can also be useful in augmenting ACA performance. These solvents include primary, secondary and tertiary alcohols, diols, glycols, glycerols, triglycerol ethers, oxygen-based esters, ceramides, sphingolipids, petroleum by-products, alkaline salts of other fatty acids or glycerolphospholipids (e.g., lecithin).

In other cases, the ACA may be encapsulated within liposomes, gels, dextrins or dextrans including cyclodextrins for protracted delivery purposes as the effective ACA is needed. For example, in one preferred model embodiment, dry porous spherical dextran beads can be independently saturated with HDA and alkali, or KHDA alone. Such embodiments of the ACA will provide time release or release on demand anti-corrosion protection to high dielectric fluids as water is accrued by the fluid and water-mediated corrosion of surrounding metal surfaces would ordinarily be promoted.

In another particularly preferred embodiment, a powdered form of the ACA may be admixed with a powdered form of any moisture retentive barrier coating material as described herein for use in powder metallurgy processes for coating metals, which are well known to those of ordinary skill in the art. Such processes provide the anticorrosive coating properties according to the invention for use, e.g., in the automotive, aerospace and tool industries without the necessity of handling large volumes of liquids.

For some desired applications of the ACA, the invention can be implemented in a solution where, e.g., less than 20 percent by weight of the liquid phase is contributed by water, and the balance of the volume is contributed by low dielectric and water miscible solvents. Such water miscible organic embodiments of the ACA may support non-corrosive storage of finely engineered medical instruments or other fine mechanical devices where the desirable antimicrobial effects of alcohol(s) for example, dovetail with the beneficial anticorrosive effects of the ACA. Required concentration levels of the ACA embodied in high dielectric solvents that contain water may be practically determined as presented in Example II. Similar embodiments of the ACA with low water content and water miscible organic solvents also provide a fluid-platform basis, with or without other adjuvants, for controlling metal oxidation.

A chief design and application criterion for implementing the method of the invention is based on the fact that metals, and particularly ferrous metals, are best protected from the perils of oxidation in a dessicated inert gas atmosphere. However, these are unrealistic conditions. Thus, in preferred embodiments, the composition and method of the invention permit a practical extension of this protection by augmenting the ACA performance properties with polymers and other viscous systems.

One preferred and widely applicable embodiment of the invention centers upon using an aqueous ACA solution according to the invention as a solvent for the admixture of polymers that impart predictably-graded degrees of (1) density, (2) molecular weight distribution, (3) viscosity, (4) hygroscopicity, (5) surface tension and (6) lubricity. Such polymers may be purely synthetic, or natural, or mixtures of natural and synthetic polymers, or represent any degree of mixed polar and non-polar properties that meet some use demand. However, incorporated together, such polymers have no innate anti-corrosion capabilities of their own. It is obvious, too, that all six of the properties cited are common performance criteria for petroleum produces and as in cases of water soluble polymers, petroleum-based substances can also be specifically varied in their compositional properties to meet certain use demands. Such adaptability to specific overlapping use applications shared by both water-soluble polymers and petroleum product could occur in many areas but the corrosion issue tied to water-based systems is often satisfactory for making decisive application choices. Although lubricity and viscosity properties of petroleum products can effectively shield ferrous metals from some corrosive reactions, petroleum products are definitely not anti-corrosion agents. Indeed, many petroleum products that temporally shield metals from rusting and oxidation undergo oxidation themselves, which obviates their anti-corrosion protection. The invention permits the admixture of a genuine anti-corrosion agent according to the invention into any fluid or viscous system with or without the contribution of any polymers to inhibit metal oxidation, including that of ferrous metals and aluminum.

Chief among favored water soluble polymers that can embody the invention are those polymers such as polyethylene glycol (PEG), methoxypolyethylene glycol (MPEG), and polyalkylene glycol (PAG) (also described as a linear polymer of propylene and ethylene oxides). The general formula for PEG is $H-[O-CH_2-CH_2]_n-OH$ and the corresponding designation for MPEG is $CH_3-[O-CH_2-CH_2]_n-OH$. For PAGs or the linear copolymers of ethylene and propylene oxides, the general formula corresponds to $X-O-[CH_2-CH(CH_3)-O]_n[CH_2-CH_2-O]_m-Z$ where subscripts "n" and "m" are average numbers of different repeating bracketed monomers namely "propylene oxide" and "ethylene oxide," "X" is a hydrogen atom (—H) or any other relevant nondiscript functional group and "Z" is a hydrogen atom (—H) or hydroxyl (—OH) group. Average molecular weights for PEGs, MPEGs and PAGs are less than 100,000 with many in the usual range of less than 15,000. Other favored embodiments of the invention can include addition of the ACA to nonionic, water-soluble poly(ethylene oxide) polymers characterized by high molecular weight ranges from 75,000 to 12,000,000 daltons.

The low concentration level of KHDA or HDA necessary to impart the anti-corrosion effect of the invention to water permits a wide variation in the use and composition of any water-inclusive polymer systems. Thus, water-based polymers according to the invention can have high or low polymer concentrations, high or low amounts of water, with or without hydrophobic components that allow wide ranging lubricity, miscibility, viscosity, solvency, boiling point, flash point, freezing point and in some cases elastomer compatabilities that remain unaffected by the anticorrosive's presence. These considerations afford possibilities for a variety of low-toxicity petroleum analogue products that are water-based and non-corrosive to ferrous and many non-ferrous based metals. The low toxicity of various glycols that already have (1) food-grade GRAS (generally recognized as safe)-status under U.S. Food and Drug Administration guidelines; or, (2) an acceptable safety status under the aegis of the United States Pharmacopeia (USP)/National Formulary (NF) guidelines for human exposure can now assume new unanticipated application uses with a GRAS-sanctioned and food-grade adjuvant such as KHDA or HDA. Whether or not some or all of these components are food-grade, GRAS or USP/NF sanctioned does not affect the performance of the anti-corrosion effects demonstrated by the invention.

Another preferred embodiment of the invention centers upon admixture of the ACA to homogenous or heterogenous polymers of amino acids including their peptide structures having molecular weights less than 5,000 daltons or unqualified protein structures greater than 5,000 daltons that are synthetically manufactured, biologically produced or genetically engineered by any route. By practical extension, use of the ACA can also be in conjunction with homo- or heteroglycan polymers of any description obtained and crafted by any route. These include ACA addition to hydrocolloidal (1) anionic seaweed polysaccharides such as agar, alginic acid polymers and carrageenan; (2) anionic exudate polysaccharides including arabic, ghatti, karaya and tragacanth gums; (3) non-ionic seed polysaccharides such as guar, locust bean and tamarind; (4) microbiologically or in vitro enzymatically synthesized polyglucans with or without proteins including but not limited to xanthan gum, cranberry extract and other extracts; and (5) any modified carbohydrate polymers such as derivatized celluloses including hydroxyethylated or carboxymethylated starches or celluloses. These embodiments are cited merely as examples and do not limit the intent and spirit of the invention applied to any numbers of polymeric substances that can benefit in use from the invention. Regardless of their USP/NF, GRAS or food-grade status, the performance of the ACA remains consistent and unaffected.

The operational principles of the invention can also be demonstrated in preferred embodiments where graphite or particulated carbon suspensions exist with the food-grade ACA so as to afford a lubricating suspension with anti-corrosion properties. The liquid fraction of the suspension can contain hydrophilic or hydrophobic components as well as various mixtures of any other adjuvants that effect the functionality of the suspension.

This embodiment does not discount the use of other adjuvants that optimize the application of the invention's concepts such as the addition of antioxidants, chelation agents, surfactants, silica and silicone oils.

Additional concerns regarding issues of environmental waste, persistence and industrial hygiene also challenge the long-term safety and routine clean-up procedures tied to the use of petroleum products. Based on these factors, water-based anti-corrosion formulations of KHDA combined with glycerol, diols, polyethylene glycols as well as water emulsified and stabilized vegetable oils (i.e., water-in-oil emulsions) can offer many advantages of petroleum products. Some of these may or may not require surfactant uses. Typical application venues for such aqueous-based, non-hydrocarbon, but petroleum-like formulations include: lubricants for metalworking, cutting oils, food machinery, grease compositions, metal part protectants (nuts, bolts, etc.), hydraulic fluids, compressor and vacuum pump oils; humectants, iron sequesterants and whiteners in paper processing; metal corrosion inhibition over food processing surfaces; toiletry formulations including adjuncts to shaving cream that ensure anti-corrosion and sharpness on metal blades and cutting edges; nonconductive alternating current transformer fluids and coolants; and many other areas.

Furthermore, the inseparable functional ability of the ACA, embodied as KHDA, to modulate the dielectric constant of water is no less important. This property allows further unexpected applications for the possible control of the specific conductivity of water as it relates to minimizing electrochemically-based metal corrosion over existing metal barrier-coatings or passivated metal surfaces; decreasing oxidative reactions between metal surfaces and biofilms; or reducing electrochemically incited adsorption between organic molecules and electrically charged solids in aqueous systems.

The low acute toxicity, non-carcinogenicity and non-teratogenic properties of the ACA disclosed here support its use as a favorable adjunct to reduce the toxicity and environmental persistence of existing less environmentally favorable ACAs. In other cases, the ACA may be selectively formulated with biocides, e.g., antioxidants, surfactants or chelators, to suit any level of microbiological challenge Beyond this, as KHDA, or HDA, is a GRAS, food-grade substance, human exposure at any stage of the life-cycle does not present any known deleterious threat or serious consequence to human health at practical use levels.

Although this invention has been described in terms of some specific embodiments which are set forth in general as well as considerable detail, it should be understood that such description is by way of illustration only and that the invention is not necessarily limited thereto, since alternative embodiments and operating techniques will become apparent to those skilled in the art in view of the disclosure. Accordingly, modifications are contemplated which can be made without departing from the spirit and intent of the invention as described. The following examples are presented to illustrate the advantages of the present invention and to assist one of ordinary skill in making and using the same. These examples are not intended in any way otherwise to limit the scope of the disclosure.

EXAMPLE I

Relationship between the Specific Conductivity for Water Solutions and Metal Anti-corrosion The active agent(s) specified as KHDA, HDA and/or their related derivatives embodied in an aqueous solution, show a concentration-dependent ability to alter the normal specific conductivity of water and its dielectric constant to an extent where superficial metal corrosion mediated by water cannot occur.

Solvent systems of domestic tap water with various concentrations of KHDA easily demonstrate the relationship that exists between specific conductivity (units in $\mu S$) of solutions as an indicator of modified electrical status and, observed levels of ferrous metal corrosion. Evidence of metal corrosion can be validated over any time-span ranging from hours to years, depending on the level of analytical sensitivity available for quantifying evidence of metal oxidation.

As reported in Table 1, an initial domestic tap water solvent demonstrated an initial DO value of 9.3 mg/mL, a pH of 8.0 and a specific conductivity of 344 $\mu S$. Formulation of a 30 percent by weight KHDA concentrate solution altered these respective parameters to 4.0 mg/mL, a pH of 8.98 and a specific conductivity of 23,700 $\mu S$. Serial dilutions of this concentrate over the range of 1.0 to 100 through dilutions of 1.0 to 500 volume-by-volume, showed progressive decreases in specific conductivity from 2150 to 700 $\mu S$ and only a small pH change in the range of 7.78±0.01. Anticorrosive effects were demonstrated on ferrous metals using this model for any formulation of the ACA at or above a 1 to 300 dilution of the 30 percent by volume concentrate solution. The onset of documented metallic corrosion shows detectable ties among decreasing concentrations of the active ingredient, increasing DO levels in various formulations of the aqueous invention, plus graded changes in the specific conductivity of the formulations as oxidative metal corrosion becomes evident. Alterations in these parameters were concentration-dependent with increasing levels of the ACA; and accordingly, higher concentrations of the active agent coincided with increased prevention of metal oxidation, corrosion and rust formation.

Even more superior anti-corrosive effects have been demonstrated, beyond those reported in Table 1, by using a KHDA solution further comprising a material capable of forming a moisture retentive barrier on the surface of the metal. If the 30 percent by weight KHDA concentrated solution, above, is made 10%–20% percent with a polyethylene glycol product, an exemplary such material, then that solution can be diluted at least 1 to 800 and still no corrosion is observed.

TABLE 1

Relationships among physical parameters of KHDA solution formulations and observed dissolved oxygen (DO) concentration levels (mg/mL), specific conductivity at 25 degrees Celsius ($\mu$S) and detectable corrosion.

| Sample | DO (mg/mL) | Specific conductivity ($\mu$S) at 25° C. | pH | Concentration of KHDA in water (grams/gallon) | Metal corrosion performance |
|---|---|---|---|---|---|
| Tap water | 9.3 | 344 | 8.00 | 0 | corrosion |
| 30 percent control solution (CS) | 4.0 | 23,700 | 8.98 | 1588 | no corrosion |
| 1:100 dilution$^{(CS)}$ | 5.0 | 2150 | 7.79 | 15.9 | no corrosion |
| 1:200 dilution$^{(CS)}$ | 6.0 | 1340 | 7.78 | 7.9 | no corrosion |
| 1:300 dilution$^{(CS)}$ | 7.5 | 1000 | 7.79 | 5.3 | no corrosion |
| 1:400 dilution$^{(CS)}$ | 8.0 | 776 | 7.76 | 3.9 | no corrosion |
| 1:500 dilution$^{(CS)}$ | 8.0 | 700 | 7.76 | 3.2 | corrosion |

EXAMPLE II

Demonstrable Links between the Consistent Anti-corrosion Performance of the Composition of the Invention, its Specific Conductivity and Altered Dielectric Properties of Water Using Five Disparate Solute Formulations Specific conductivities and dielectric features of water have been found to correlate with metal anti-corrosion set-points in standardized aqueous test solution matrices that permit the predictable performance of the invention.

A test matrix of different aqueous systems was created that contained different solutes, suspensions and/or dispersions that strategically altered the dielectric (D) property of water, its specific conductivity and its ability to mediate electron flow between reducing and oxidizing agents. In contrast to Example I, in this Example, only highly purified distilled and deionized water was employed. The purpose of this example was to establish a range of aqueous solution standards that provided a series of specific conductivity values from approximately 2.0 to at least 20,000 $\mu$S. A total of five separate standard aqueous systems were formulated including one for cellulose (Solution A), another for lecithin (Solution B), one for KHDA (Solution C), a separate solution for a combined mixture of KHDA plus cellulose (Solution D), and a final solution of 190 proof ethanol (Solution E). Solution A was prepared from 5.0 grams/100 mL of microparticulated cellulose; Solution B consisted of emulsified soy lecithin at a concentration of 5.0 grams/100 mL; Solution C had KHDA at 10 grams/100 mL; Solution D was prepared from KHDA at 5.0 grams/100 mL plus cellulose at 2.5 grams/100 mL; and Solution E consisted of ethanol (hereinafter EtOH) and water (HOH) formulated over a percent composition [percent $_{comp}$] range from 100 percent EtOH and 0.0 percent water ([percent $_{comp}$]=[100/0]) to 0.0 percent EtOH and 100 percent HOH ([percent $_{comp}$]=[0/100]). The solutions designated here and above as Solutions A–E, are respectively presented in the context of Table 2 (Heading) as Solute dilution #1. Solute dilution #1 for each of the respective five various solutions specified above were then serially diluted by one tenth (0.1 times) over five serial dilutions to a final diluted concentration that was a factor of $1.0 \times 10^{-5}$ times smaller than the original concentrations for Solutions A–E. This resulted in a test matrix of thirty 0.2 L solutions contained within individual pyrex glass bottles. Each volume of liquid contained 0.5 grams of 0.05 mm ferrous-based steel wool with a 8.0 cm$^3$ volume. The specific conductivity for each of the 30 solutions was recorded immediately after formulation as an initial value and again after 168 hours of dark incubation as a final value at 21.0° C. Table 2 shows the tabulated results of these specific conductivity studies.

All samples in the specific conductivity test matrix were evaluated for total suspended and dissolved iron in the aqueous volume after 168 hours and considered to demonstrate corrosion when detectable aqueous iron levels equaled or exceeded 100 $\mu$g/100 mL. This was verified using the standard method of spectrophotometric analysis based on 1,10-phenanthroline reagent (American Public Health Association. 1981. Standard Method 315 B. Pp. 201–206. Standard Methods for the Examination of Water and Wastewater. 15th Ed. Washington, D.C.).

Referring to Table 2, it can be seen that the anticorrosive performance effects of the formulation according to the invention are consistent with demonstrated specific conductivities of formulated aqueous-specific conductivities above and below a measurable value of 11.7 $\mu$S for the aqueous test matrix system employed here using highly purified water. Specific conductivities of 11.7 $\mu$S and above for this test matrix demonstrate no corrosion activity whatsoever and values less than this produce significant corrosion including dissolution of the metal study probe. Thus, corrosion and oxidation of any specific metal in a uniformly comparable aqueous environment, may be predictable in a context of completely unrelated and chemically diverse substances that produce similar specific conductivities with or without identical dielectric properties. Furthermore, these data demonstrate that a specific conductivity set-point exists in this model which is unique to the redox potential existing between a corrosible metal and its surrounding aqueous test system.

TABLE 2

Measurement of specific conductivity ($\mu$S) correlates with corrosion and anti-corrosion sequelae in model aqueous systems. Relative specific conductivities are tabulated for different aqueous concentration levels of solutes and suspensions in a 0.2 L volume before and after reaction with 0.05 mm ferrous-based wool (0.5 g) for a period of 168 hours. Specific conductivities are expressed in standard microsiemen ($\mu$S) units at the initial outset of the test matrix study-for each test solution plus its serial dilutions; and as a final value after a 168 hour reaction period after which evidence of metal corrosion was assessed and recorded is indicated in the text. The bold underlined entries in the Table designate the first solute concentration and its corresponding specific conductivity where any evidence of corrosion was documented. In nearly every case, corrosion was complete to a level metal fragmentation and dissolution.

Solute dilutions*

| Aqueous system | #1 | #2 | #3 | #4 | #5 | #6 |
|---|---|---|---|---|---|---|
| Cellulose (initial) | 17.9 $\mu$S | 9.4 $\mu$S | 6.8 $\mu$S | 6.8 $\mu$S | 6.2 $\mu$S | 6.0 $\mu$S |
| Cellulose (final) | 29.9 $\mu$S | 11.2 $\mu$S | 8.8 $\mu$S | 7.8 $\mu$S | 7.2 $\mu$S | 7.8 $\mu$S |
| Lecithin (initial) | 710 $\mu$S | 48.4 $\mu$S | 10.4 $\mu$S | 7.7 $\mu$S | 6.3 $\mu$S | 6.51 $\mu$S |
| Lecithin | 556 $\mu$S | 52.7 $\mu$S | 10.6 $\mu$S | 10.3 $\mu$S | 6.9 $\mu$S | 7.1 $\mu$S |

TABLE 2-continued

Measurement of specific conductivity ($\mu S$) correlates with corrosion and anti-corrosion sequelae in model aqueous systems. Relative specific conductivities are tabulated for different aqueous concentration levels of solutes and suspensions in a 0.2 L volume before and after reaction with 0.05 mm ferrous-based wool (0.5 g) for a period of 168 hours. Specific conductivities are expressed in standard microsiemen ($\mu S$) units at the initial outset of the test matrix study-for each test solution plus its serial dilutions; and as a final value after a 168 hour reaction period after which evidence of metal corrosion was assessed and recorded is indicated in the text. The bold underlined entries in the Table designate the first solute concentration and its corresponding specific conductivity where any evidence of corrosion was documented. In nearly every case, corrosion was complete to a level metal fragmentation and dissolution.

Solute dilutions*

| Aqueous system | #1 | #2 | #3 | #4 | #5 | #6 |
|---|---|---|---|---|---|---|
| (final) KHDA | 1337 mS | 20.5 mS | 414 $\mu S$ | 22.1 $\mu S$ | 10.4 $\mu S$ | 7.4 $\mu S$ |
| (initial) KHDA | 1257 mS | 19.3 mS | 400 $\mu S$ | 22.7 $\mu S$ | 10.6 $\mu S$ | 10.1 $\mu S$ |
| (final) KHDA + cellulose | 11.4 mS | 20.0 mS | 481 $\mu S$ | 22.5 $\mu S$ | 10.6 $\mu S$ | 6.8 $\mu S$ |
| (intial) KHDA + cellulose | 1195 mS | 19.9 mS | 609 $\mu S$ | 23.9 $\mu S$ | 11.7 $\mu S$ | 9.1 $\mu S$ |
| (final) EtOH:HOH (initial) [percent comp.] | 2.3 $\mu S$ [100/0] | 2.2 $\mu S$ [80/20] | 2.3 $\mu S$ [60/40] | 2.7 $\mu S$ [40/60] | 4.2 $\mu S$ [20/80] | 5.6 $\mu S$ [0/100] |
| EtOH:HOH (final) [percent comp.] | 5.3 $\mu S$ [100/0] | 2.1 $\mu S$ [80/20] | 2.7 $\mu S$ [60/40] | 3.5 $\mu S$ [40/60] | 6.2 $\mu S$ [20/80] | 9.0 $\mu S$ [0/100] |

*Solute dilutions indicated as #2–#6 represent a range of 10-fold serial dilutions for initial solute concentrations indicated as #1 that were formulated and identified as Solutions A–E which include: (A) cellulose (5.0 grams per 100 mL); (B) soy lecithin (5.0 grams per 100 mL); (C) KHDA (10.0 grams per 100 mL) and (D) KHDA + cellulose mixtures were respectively (5.0 grams/100 mL) + (2.5 grams/100 mL). The ethanol/water concentration mixtures shown in the Table are self-explanatory and begin at 100 percent ethanol (190 proof) (E).

EXAMPLE III

The Altered Conductivity and Dielectric Constant Associated with the Composition of the Invention and its Anti-corrosion Performance Permits Non-insulated, Exposed Wires to Conduct Electrical Current through a Resistor while Submerged in Water The invention alters the ordinary electrical performance and conductivity of water, which is a prerequisite to anti-corrosion claims or functions based on oxidation-reduction (redox) theory. This has been validated by the ability of the aqueous invention to maintain operation of an electrical circuit by supplying electric current through non-insulated copper wires to a functioning resistor all of which are submersed under water using the invention.

The high dielectric constant (D) as well as the ability of the aqueous invention to alter the electrical resistance properties of water have been readily demonstrated by preparing an exhibit specified by the following protocol. A 75-watt light bulb encased in a waterproof cover—only to protect the bulb from thermal stress—was wired directly to a 120-volt AC power supply. Both wires that supplied electrical current to the light bulb were stripped of all insulation over a length of at least 4.0-cm. The entire experimental illumination device was then submerged in at least 3.0 gallons of tap water containing 40 percent by weight KHDA that represented one formulation of the aqueous invention. Actuation of the 120-volt AC electrical supply caused illumination of the light source underwater for unlimited times. This illumination persisted quite apart from the fact that all the electrical connections to the light fixture-and wires free of insulation, were submerged in at least 3.0 gallons of water formulated with the aqueous invention. Compared to the dielectric constant (D) of ordinary tap water and the ordinary ability of water to mediate a flow of electrons, such a system constructed without the aqueous invention would have immediately shorted-out and/or tripped circuit breakers. This invention however, obviated such an eventuality and noninsulated electrical wires and connections continued an uninterrupted supply of current to the circuit that illuminated the light.

TABLE 3

Elemental pedigree and analysis profiles for metal coupons designed for and subjected to anti-corrosion studies.

| Element | 1010 Steel | 1050 Steel | 12L14 Steel | 303 Stainless steel | 1100 Aluminum |
|---|---|---|---|---|---|
| Carbon | 0.11 | 0.51 | 0.08 | 0.04 | — |
| Manganese | 0.42 | 0.62 | 1.01 | 1.70 | — |
| Phosphorus | 0.011 | 0.009 | 0.083 | 0.019 | — |
| Sulfur | 0.009 | 0.009 | 0.250 | 0.316 | — |
| Silicon | 0.005 | 0.028 | 0.008 | 0.51 | — |
| Nickel | — | — | — | 7.9 | — |
| Chromium | — | — | — | 18.0 | — |
| Molybdenum | — | — | — | 0.26 | — |
| Aluminum | — | — | — | — | 100.0 |

EXAMPLE IV

A Composition according to the Invention Prevents Metal Corrosion by Eliminating Oxygen Reactivity with Metal Surfaces, in Addition to Altering the Conductivity and Dielectric Constant of Water, Based on Energy Dispersive X-ray Spectroscopic (EDS) Analysis, Scanning Electron Microscopy (SEM) and other Quantifiable Metallurgical Protocols The aqueous anti-corrosion agent (ACA) halts the ordinary electrochemical reactivity of oxygen in water with superficial metal atoms that would normally undergo metal corrosion, cracking and rusting. This effect has been verified on the basis of 133 photomicrographic and energy dispersive X-ray analyses that validate the proven absence of oxygen-based corrosion on the surfaces of metals when they are exposed to the aqueous invention.

The practical consequence of the ability of an aqueous system according to the invention to exhibit altered specific conductivity, dielectric constant and dissolved oxygen levels was readily demonstrated on the basis of anti-corrosion effects it exerted on pedigreed metal coupons immersed in water. Included among these metal coupons were low carbon 1010 steel, high carbon 1050 steel, 12L14 steel, 303 stainless steel and 1100 aluminum. The elemental pedigrees for such metal coupons have been detailed in Table 3. The respective individual pedigreed coupons were immersed in separate fixed aqueous volumes (0.140 L) with or without the active agent of the invention at a concentration level of 30 percent by weight. Further aqueous immersion solutions were also prepared for metal corrosion studies consisting of 70 percent isopropyl alcohol by volume and 30 percent tap water, as well as 70 percent isopropyl alcohol by volume and 30 percent tap water containing 30 percent by weight of active agent described in this document. These individually prepared model aqueous systems along with their respective metal coupons were separately and singularly subjected to temperatures of 70° and 120° F. for a total of 540 hours. Continuous efforts were made to ensure maintenance of a constant 0.140 L aqueous test volume during the 540 hour test period, thereby minimizing water evaporation effects that could have caused solute concentration and associated interpretation errors regarding the invention's anti-corrosion efficacy.

Following the 540-hour immersion period, all metal coupons were inspected for identifiable evidence of corrosion by using several methods. The procedures and test methods used generally conformed to the American Society of Testing Materials (ASTM) Standard G31-72 protocol embodied in the "Standard Practice for Laboratory Immersion Corrosion Testing of Metals." The only exception to the protocol involved the preferential use of more sensitive scanning electron microscopy and metallographic cross-sectioning to precisely determine the depths of any metal corrosion as opposed to gravimetric weight loss determinations from the coupons. Study and documentation of corrosion results were ensured by reliable lines of instrumental analysis, physical and chemical evidence. Quite apart from generalized surface color photography of metal coupons subjected to aqueous corrosion challenges, each coupon was analyzed by cross-sectional photomicrography (hereinafter CSPM), SEM and EDS analysis. EDS analysis was especially important in this study since it provided sensitive and definitive evidence for any inclusion of elemental oxygen on superficial corrosion deposits of metal couponic probes (Skoog, D. A., F. J. Holler, T. A. Nieman. 1998. Principles of Instrumental Analysis. 5 th Ed., Harcourt Brace and Company, Philadelphia. Pp. 272–296, hereinafter "Skoog et al., 1998" ; G. W. Ewing. 1969. Instrumental Methods of Chemical Analysis, McGraw Hill, New York. Pp. 195–222, hereinafter "Ewing, 1998".

Whereas gross visual color photographic documentation for corrosion on the post-immersion metal coupons provided useful anecdotal evaluation indices, CSPM more clearly documented corrosive pitting and cracking of metal coupons. Beyond this however, combined SEM and EDS studies not only provided three-dimensional photographic surface images of metal coupon corrosion sites if they developed, but EDS analysis fingerprinted any alterations in the elemental composition of metal coupons due to water-mediated electron transfers involving oxygen-based corrosion mechanisms. The quantifiable lower validation limits for evidence of corrosion pits and cracks on pedigreed metal coupons using CSPM were approximately 0.0005 cm, whereas development of metal corrosion byproducts using SEM and EDS can be validated at levels of 0.1 $\mu$m (Skoog et al., 1998; Ewing, 1969).

The anti-corrosion efficacy of this aqueous invention has been predicated on its ability to block water-mediated redox (electrochemical) reactions between oxygen and metal surfaces. This effect is considered to be separate and distinct from any performance of the anticorrosive agent functioning as an organic barrier coating over metal surfaces (Hare, 2000) or its performance as a mixed inhibitor (Papavinasam, 2000) as defined by literature. Thus, it was imperative to demonstrate that metals subjected to the aqueous invention would not undergo corrosion and metals that do not undergo corrosion will not show surface evidence of elemental oxygen addition as observed in ordinary corrosion scenarios where the anticorrosive agent was absent. Apart from SEM imaging, EDS was critical for evaluating part per million levels of oxygen incorporated in corrosion byproducts superficially deposited as scale or coated onto metal couponic specimens.

Table 4 presents a summary of analytical results for the aqueous invention in terms of the test matrix detailed above and its ability to prevent aqueous corrosion of metals. Attention is also directed to performance terminology of the aqueous invention indicated as "No corrosion" within Table 4. Assignment of this decisive "performance claim" to any individual study represented within the context of the test matrix was justified only after all limits of photographic, micrographic and scanning electron microscopy results failed to detect corrosion evidence. This was especially true where the lower limits of corrosion detection and pitting were 0.0005 cm for CSPM and 0.01-$\mu$m for SEM-EDS studies. More importantly, evidence of validated anti-corrosion claims for the aqueous invention were reported only when energy dispersive X-ray analyses failed to reveal any evidence of surface oxygen levels, indicative of metal corrosion after 540 hours of couponic immersion in water.

Thus, the method of the invention clearly inhibits metal tarnishing, oxidation, corrosion, scale, pitting metallic staining associated with these phenomena and any other surface chemical reactions on carbon steels, stainless steels and free-matching steel alloys. These effects are clearly observed at experimental temperatures up to but not limited to 120° F. Moreover, the performance of a test solution according to the invention extends to inhibiting aluminum oxidation in certain low dielectric constant solvent embodiments of the invention demonstrated by, but not limited to, isopropyl alcohol in this performance validation study. Beyond these studies, the anticorrosive performance of a composition according to the invention, as well as its chief active agent, extends to anti-corrosion mechanisms where sulfur occurs with or without the presence of oxygen atoms.

TABLE 4

Pedigreed metal corrosion test results using various aqueous systems with and without the aqueous invention in tap water and alcohol at two different temperatures.

| Metal coupon sample number | Pedigreed coupon type (Table 3) | Type of immersion test solution* | Temp. (° F.) | Summary of corrosion results |
| --- | --- | --- | --- | --- |
| 1 | 1010 | Tap water | 70 | Surface corrosion |
| 2 | 1010 | Anticorrosion agent + tap water | 70 | No corrosion |
| 3 | 1010 | Tap water | 120 | Surface corrosion and pitting |

TABLE 4-continued

Pedigreed metal corrosion test results using various aqueous systems with and without the aqueous invention in tap water and alcohol at two different temperatures.

| Metal coupon sample number | Pedigreed coupon type (Table 3) | Type of immersion test solution* | Temp. (° F.) | Summary of corrosion results |
|---|---|---|---|---|
| 4 | 1010 | Anticorrosion agent + tap water | 120 | No corrosion |
| 5 | 1010 | Alcohol + tap water | 70 | Surface corrosion and pitting |
| 6 | 1010 | Alcohol + anticorrosion agent | 70 | No corrosion |
| 7 | 1050 | Tap water | 70 | Surface corrosion and pitting |
| 8 | 1050 | Anticorrosion agent + tap water | 70 | No corrosion |
| 9 | 1050 | Tap water | 120 | Surface corrosion and pitting |
| 10 | 1050 | Anticorrosion agent + tap water | 120 | No corrosion |
| 11 | 1050 | Alcohol + tap water | 70 | Surface corrosion and pitting |
| 12 | 1050 | Alcohol + anticorrosion agent | 70 | No corrosion |
| 13 | 12L14 | Tap water | 70 | Surface corrosion and pitting |
| 14 | 12L14 | Anticorrosion agent + tap water | 70 | No corrosion |
| 15 | 12L14 | Tap water | 120 | Surface corrosion and pitting |
| 16 | 12L14 | Anticorrosion agent + tap water | 120 | No corrosion |
| 17 | 12L14 | Alcohol + tap water | 70 | Surface corrosion and pitting |
| 18 | 12L14 | Alcohol + anticorrosion agent | 70 | No corrosion |
| 19 | 303 | Tap water | 70 | Slight pitting |
| 20 | 303 | Anticorrosion agent + tap water | 70 | No corrosion |
| 21 | 303 | Tap water | 120 | Slight corrosion and pitting |
| 22 | 303 | Anticorrosion agent + tap water | 120 | No corrosion |
| 23 | 303 | Alcohol + tap water | 70 | No corrosion |
| 24 | 303 | Alcohol + anticorrosion agent | 70 | No corrosion |
| 25 | 1100 Al | Tap water | 70 | Surface corrosion |
| 26 | 1100 Al | Anticorrosion agent + tap water | 70 | Only slight corrosion |
| 27 | 1100 Al | Tap water | 120 | Extensive corrosion and pitting |
| 28 | 1100 Al | Anticorrosion agent + tap water | 120 | Only slight corrosion |
| 29 | 1100 Al | Alcohol + tap water | 70 | Slight corrosion |
| 30 | 1100 Al | Alcohol + anticorrosion agent | 70 | No corrosion |

EXAMPLE V

Prevention of Oxidative Metal by Product Migration through Porous Media Using a Composition according to the Invention Proof-of-performance principles justified on the basis of Examples I–IV support the contention that the invention prevents metal oxidation and corrosion. It is further shown in this case that the invention also halts formation of highly colored metal oxidation byproducts as well as any oxidized iron as $Fe^{3+}$. This effect obviates evidence of their subsequent migration through porous matrices as measurable "stains" using sensitive spectrophotometric reflectance measurements. More importantly, this same exhibit demonstrates that the active ACA used in the invention, provides a persistent molecular anti-corrosion barrier over the surface of dry metals after their initial contact with the aqueous ACA.

Under ordinary circumstances, water-mediated metal oxidations and corrosion yield highly colored metal oxides and cationic species. These substances represent the source of many intractable stains that develop on metal surfaces, tile, porcelain, masonry and porous matrices such as plaster. An additional embodiment of the composition of the invention will prevent such staining phenonomena by blocking the initial oxidation of metals and any added sequelae associated with producing highly colored cations.

This claim can be demonstrated using plaster of paris (POP)-based steel wool corrosion studies formulated with and without water that incorporated the aqueous invention. Two formulations of this metal corrosion and staining model probe were developed and designated as POP Formulation 1 (POPF-1) and POP Formulation 2 (POPF-2). Both POPF-1 and POPF-2 were prepared by admixture of 600 grams of dry POP to 25 grams of 1.0-cm long steel wool fibers (0.05 mm) plus 260–280 mL of water. Although POPF-1 formulations used steel wool immersed in plain water before being introduced into the POP, POPF-2 formulations used steel wool immersed in a 20 percent by weight solution of the aqueous invention before admixture to the dry POP. The remaining 260 to 280-mL volume of water was then admixed to the respective formulations, but as opposed to POPF-1 that employed plain water, POPF-2 used a 5.0 percent by weight solution of the aqueous invention. Both and POPF-1 and POPF-2 slurries were thoroughly mixed and molded into 14.0-cm discs with a 2.0-cm thickness. These were allowed to exothermically harden and cure for 5 days at which time they were analyzed for spectral reflectance using a computer-based Hunter Lab L, ±a, ±b color coordinate theory appearance analysis.

The POPF-1 formulation that employed untreated water produced a final plaster product embedded with totally corroded steel wool that leached highly colored, red-orange-brown iron oxides and stains to the surface of the sample disc. The POPF-2 formulation that employed the aqueous invention produced a final plaster product embedded with shiny uncorroded steel and no appearance of colored iron oxide that leached or stained through the cured porous plaster matrix. Using the POPF-1 cured and corroded disc as the typical expected outcome for such a study, it was designated as the Control for spectral color reflectance analysis. Six (6) additional color analysis studies identified as Samples 1–6 in Table 5 were determined for POPF-2 formulations that demonstrated the desirable effects of the aqueous invention. These samples all distinctly indicated absences of any embedded or colored corrosion evidence within the cured white plaster matrix. Color reflectance data detailed for Sample 7 revealed a duplicate spectral analysis for an independently prepared Control (POPF-1 sample preparation) in order reaffirm the analytical credibility of spectral reflectance data using the initial baseline reference Control study. The individual differences between total spectral reflectance for the so-called Control that displayed corrosion and staining as opposed to the individual spectral appearances for all POPF-2 samples (Samples 1–6) as well as the additional calibration Control analyses are indicated by the DE-value in Table 5. Exhibit 2 supplies the spectral reflectance data associated with results in Table 5 along with the direct color reflectance relationship to the color spectrum as evidence of the aqueous invention's performance. Interpretation significance of Table 5 color data abides by applications of uniform color scale theory where a tri-coordinated scale corresponds to black (0)-white (100) (L); red-green (±a) and yellow-blue (±b). Extreme values of the ±a and ±b scales correspond to saturated red (+a), green (−b), yellow (+b) and blue (−b) (Zapsalis C. and R. A. Beck. 1985. Pp. 577–578). Analytically, Table 5 shows strong quantitative improvement in whiteness (L), a decreased red (+a) component of light due to decreased levels of iron oxide and a loss of the yellow (+b) spectral component-all being the result of effective implementation of the aqueous invention.

Thus, a composition according to the invention continued to resist condensed moisture-mediated corrosion on steel wool incorporated in the POPF-2 model for an extended period of time after the plaster matrix has thoroughly dried and aged. Thus, apart from the anticorrosive functions of KHDA, HDA or its various derivatives in the context of an aqueous solution, these active ingredients offer a margin of persistent metal anti-corrosion activity outside the confines of the continuous immersion application.

TABLE 5

Hunter L−, ±a, ±b reflectance color coordinate data for the relative appearances of different formulations of steel wool embedded in POPF's 1 and 2 to prove the efficacy of the aqueous invention for preventing metal oxidation, corrosion and rust migration and staining through a porous matrix.

| Type of sample test preparation | Sample identification | L− Scale; 0→100 = Black→White | ±a Scale | ±b Scale | DE-value or color difference |
|---|---|---|---|---|---|
| POPF-1 | Control (cal)* | 76.77 | 5.61 | 14.92 | — |
| POPF-2 | Sample 1 | 90.08 | 0.54 | 2.14 | 19.45 |
| POPF-2 | Sample 2 | 86.38 | 0.76 | 4.30 | 14.75 |
| POPF-2 | Sample 3 | 89.42 | 0.59 | 2.19 | 18.76 |
| POPF-2 | Sample 4 | 87.78 | 0.68 | 3.68 | 16.40 |
| POPF-2 | Sample 5 | 85.75 | 0.91 | 6.04 | 13.30 |
| POPF-2 | Sample 6 | 89.26 | 0.55 | 2.18 | 18.62 |
| POPF-1 | Control (dup) | 75.31 | 5.36 | 14.59 | 1.74 |

*Control (cal) represents baseline calibration Control against which all other color reflectances are compared in order to determine a color difference calculation (DE). The Control (dup) entry represents an additional analysis of a Control (POPF-1) to validate the performance of the Control against itself and the DE value is calculated as a negligible value of 1.74.

EXAMPLE VI

Metal Ion Sequestration and Anti-corrosion Barrier Formation

Enzyme and nonenzyme-mediated destruction of proteins and amino acids in ingestible and noningestible aqueous liquids typically involve the availability of metal cations such as iron ($Fe^{2+}$ or $Fe^{3+}$) but not to the exclusion of other metals. Limitation of cation availability to microorganisms or their ability to mobilize metal cations from ferrous or ferric metals facilitates their growth and survival. Many of their subsequent life-sustaining biochemical actions are tied to sulfur-based amino acids that exist free or as constituents of proteins. Added to the previous mechanistic and performance justifications presented in the preceding experiments, this experiment shows that the water soluble active agent(s) according to the invention also sequester some biologically important metal cations. Sequestration of metal ions then obviates possible levels of microbial growth.

Showing the ability of the active agent of the invention to effectively decrease free metal cation concentrations in aqueous environments involved preparation of a 40 mL volume of standard ferric chloride solution at 0.80 mg/mL, which was subsequently dispensed as 8.0 mL volume aliquots over five separate reaction tubes. A 30 percent by weight formulation of the aqueous invention (e.g., KHDA, 0.30 g/mL) was prepared and serially diluted to give four additional solutions of the active agent with concentrations of $3.0 \times 10^{-2}$, $3.0 \times 10^{-3}$, $3.0 \times 10^{-4}$ and $3.0 \times 10^{-5}$ g/mL. A 2.0 mL volume of each respective formulation was admixed to 8.0 mL of ferric chloride ($FeCl_3$) in each prepared reaction tube, tubes were allowed to react for 24 hours, centrifuged and then spectrophotometrically evaluated at 475 nm for residual ferric ($Fe^{3+}$) ions in the post-reaction supernatant volume. The highest 0.30 g/mL concentration of the active agent for this invention sequestered and removed at least 99.5 percent by weight of the detectable ferric cations ($Fe^{3+}$) from aqueous solution and the lowest concentration (i.e., $3.0 \times 10^{-5}$ g/mL) removed less than 1.0 percent by weight.

EXAMPLE VII

Corrosion Testing of 416 Stainless Steel Bar Samples

Quarter inch diameter 416 SS bar samples were used as the test specimens. The 416 SS grade of material is a resulphurized version of 410 SS, which has improved machinability and processing economics but which suffers from a significantly lower corrosion resistance. Normally, this material tends to form a red rust surface during storage. The test samples were covered with rust and had to be ground and cleaned to remove the affected surface before use. Four inch lengths of bar were used for each test sample. Three samples were individually coated with one of the following coating systems provided: Solution #1–5% potassium sorbate and 5% carbowax (polyethylene glycol-8000, Union Carbide Corporation), Solution #2–5% potassium sorbate and 10% carbowax, and Solution #3–5% potassium sorbate and 20% carbowax. One sample was then left uncoated and used as a control. In each case, the test sample was immersed in the indicated solution, mildly agitated for approximately 30 seconds, removed and allowed to dry on a wire mesh rack.

The control and the coated and dried test samples were then placed in an environmental test chamber. The test samples were then exposed to a high humidity, salt spray environment at approximately 95° F. for a period of four weeks. Temperature and humidity were monitored on a daily basis. Temperatures were maintained between 95 and 100° F. over this period and the relative humidity was measured to be >90% at all times. Each sample was removed from the test chamber and evaluated at the two week, three week and four week period.

The test results indicate that any of the three coating systems tested effectively prevented the corrosion of 416 SS bars in the severe environmental exposure conditions of the test. The non-coated control sample exhibited pitting corrosion after approximately ten days of exposure. This minimal corrosion resistance would be expected from the resulpherized 416 SS material. However, with the test coatings, no corrosion was observed on the surfaces of the test samples even after four weeks (28 days) of exposure. The samples also showed no signs of any developing corrosion, and it is likely that they would last significantly longer without corrosion under these same environmental conditions.

No coating system is known that could afford the same protection as was observed here for 416 SS that is not an organic, enamel or metallic paint, or direct metal plating system. An oil or organic coating system could not provide the surface protection in this environment for much more than the one week period of time that the base 416 SS metal already exhibits. Additionally, organic and metallic coating have to be removed by mechanical or chemical processing methods. However, the coating systems of the invention can easily be rinsed off under running water.

EXAMPLE VIII

Corrosion Testing of Coated Low Carbon Steel Bar Samples

Quarter inch diameter 1010 (low carbon) steel bar samples were tested in a similar manner as for Example VII.

The control samples and the coated test samples were wrapped in a layer of absorbent paper and a layer of wax paper, to resemble wrap and ship conditions, and then placed in the environmental chamber. The test samples were exposed to a high humidity environment at approximately 90° F. for a period of three weeks. Temperature and humidity were monitored on a daily basis. Temperatures were maintained between 88 and 91° F. over this period and the relative humidity was measured to be >80% at all times. The test was later continued at a higher temperature of 110 to 112° F. with >90% relative humidity for another two week period.

Each sample was removed from the test chamber and evaluated at the one week, three week and additional two week period. After each evaluation period, the test samples were relocated and rewrapped.

The test results indicate that any of the various coating systems tested effectively prevented corrosion of low carbon steel bars in the severe environmental exposure conditions of the test system. The non-coated control samples exhibited substantial corrosion after approximately one week exposure at 90° F. temperature and >80% relative humidity in both the wrapped and unwrapped condition. This steel alloy, having little or no inherent corrosion resistance, would be expected to corrode quickly under these environmental conditions The test coating system effectively prevented the corrosion of this material for a total of five weeks under these harsh environmental conditions, indicating that the coating system of the invention is effective at preventing the corrosion of ferrous products at temperatures up to 110° F. and relative humidity in excess of 90%, in a dip, wrap and ship or store application.

EXAMPLE IX

Metallurgical Evaluation of Chromium Plated Steel Sheet Samples

Samples of sheet steel were sand blasted, cleaned and then dipped in a coating solution according to the invention consisting of 5% by weight potassium sorbate and 10% by weight CARBOWAX® (Polyethylene glycol-8000, Union Carbide Corporation). The coated test samples were then placed on a rack and flash plated with a very light chromium ("Satin Chrome") plate at 7.4V for 15–120 sec. The coated and plated test samples and the appropriate controls were then placed in a corrosive environment for a period of over seven weeks. Each sample was then sectioned. One half of each sample was given a salt-water bath exposure for three days, while the other half was kept in an air environment.

Optical evaluation revealed that the only corrosion was on the cut end of the samples that had been exposed to the subsequent salt-water bath. The remaining portion of the sample pieces had no visible evidence of corrosion. Scanning Electron Microscope (SEM) evaluation of the coated surface gave a similar result. Energy Dispersive Spectroscopy (EDS) analysis on the general surface of a sample revealed that the depth of chromium plate was one to three microns.

The test results indicate, first, that a chromium plate can adhere to a test specimen coated with the corrosion resistant composition according to the invention. Second, this test showed that the chromium film was only 1–3 microns. This thickness of chromium in and of itself would not be expected to provide significant corrosion resistance. Therefore, pre-treatment with the corrosion resistant solution of the invention must have imparted a substantial corrosion resistance to the surface of these steel sheet samples while the light chromium plate appears to provide additional corrosion resistance as well as resistance to abrasion and wear.

These test results show that pre-treatment of a metal surface with a composition according to the invention can improved the corrosion resistance of chromium plated metals. The very thin chromium plate coating in combination with an anti-corrosion coating according to the invention allowed the samples to survive a two month exposure to a normally corrosive environment. In addition, this undercoating can also be used as a primer for water based paints and in the auto, truck and marine industries and wherever else coatings are applied.

EXAMPLE X

Specific Formulations and Uses Thereof

1, Preparation and Use of Basic Stock Solution:

To 1589 g of potassium sorbate (42% by weight per gallon), add tap or de-ionized water to bring to 2838 mL. Let settle for 30–60 minutes. Filter through one micron filter.

To 378.4 g of polyethylene glycol-8000 (10% by weight per gallon), add tap or de-ionized water to bring to 946 mL. Let settle 4–6 hours.

Add polyethylene glycol-8000 solution, 946 mL, to potassium sorbate solution, 2838 mL, to form a gallon of stock solution (3784 mL).

Seal the stock solution with nitrogen (desirable to prevent the breakout of potassium sorbate, which has a tendency to polymerize). After opening a batch, use it within 60 days.

Formulation Coatings:

The above stock solution can be diluted, e.g., 1:5 or 1:10 with a combination of polyethylene glycol-8000 and water to give a ready to use coating solution. It is desirable to have an equal amount or an excess of polyethylene glycol compared to potassium sorbate in the final solution. A metal or metal-containing device can be dipped in the coating solution, or the solution may be sprayed or brushed on the metal or metal-containing device.

Heat at 120° F. for best results. The drying time is determined by the concentration of polyethylene glycol-8000 and is usually between one hour to eight hours

2, Immersion Stock Solution with EDTA and Ascorbic Acid (no Polyethylene Glycol):

To 1513.6 g of potassium sorbate (40% by weight per gallon), add tap or de-ionized water to bring to 2838 mL. Let settle 30–60 minutes. Filter through one micron filter.

To 189.2 g EDTA (5% by weight per gallon) and 189.2 g ascorbic acid (5% by weight per gallon), add tap or de-ionized water to bring to 946 mL. Let settle 30 minutes. EDTA and ascorbic acid are compounds with anti-oxidant properties.

Add the above 946 mL anti-oxidant solution to the 2838 mL of potassium sorbate solution. Seal with nitrogen.

This solution can also be used in the agricultural industry as a preservative at a dilution of 1:25 up to 1:50 by volume.

3, Stock Solution with EDTA and Ascorbic Acid:

To 1513.6 g potassium sorbate (40% by weight per gallon), add tap or de-ionized water to bring to 2838 mL. Let settle 30–60 minutes. Filter through one micron filter To 75.68 g polyethylene glycol-8000, (2% by weight per gallon), add tap or de-ionized water to bring to 189.2 mL. Let settle 4–6 hours.

To 189.2 g EDTA (5% by weight per gallon) and 189.2 g ascorbic acid (5% by weight per gallon), add tap or de-ionized water to bring to 756.8 mL. Next, add the 189.2 mL of polyethylene glycol-8000 to the 756.8 anti-oxidant solution to equal 946 mL.

Add the 946 mL polyethylene glycol, EDTA, ascorbic acid solution to 2838 mL of the potassium sorbate solution; seal with nitrogen. Use in a 1:10 dilution for coatings, and in a 1:25 and 1:50 dilution for agricultural use.

4, Stock Solution with EDTA and Various Anti-oxidants:

To 1513.6 g of potassium sorbate (40% by weight per gallon), add tap or de-ionized water to bring to 2365 mL. Let settle 30–60 minutes. Filter through one micron filter.

To 189.2 g of polyethylene glycol-8000 (5% by weight), add tap or de-ionized water to bring to 473 mL. Let settle 4–6 hours.

To 189.2 g EDTA (5% by weight per gallon), 189.2 g ascorbic acid (5% by weight per gallon) and 189.2 g cranberry extract (5% by weight per gallon), add tap or de-ionized water to bring to 946 mL. Let settle.

Add the 473 mL polyethylene glycol-8000 solution to the 946 mL anti-oxidant solution. Then, add the combined solution to 2365 mL potassium sorbate solution. Seal with nitrogen.

Formulation Coatings:

The above stock solution can be diluted, e.g., 1:5 or 1:10 with a combination of polyethylene glycol-8000 and water to give a ready to use coating solution. It is desirable to have an equal amount or an excess of polyethylene glycol compared to potassium sorbate in the final solution. A metal or metal-containing device can be dipped in the coating solution, or the solution may be sprayed or brushed on the metal or metal-containing device.

Heat at 120° F. for best results. The drying time is determined by the concentration of polyethylene glycol-8000 and is usually between one hour to eight hours.

5, 50% Stock Solutions:

To 1892 g of potassium sorbate (50% by weight per gallon), add tap or de-ionized water to bring to 3784 ml. Let settle 30–60 minutes. Filter through one micron filter.

To 1892 g of polyethylene glycol-8000 (50% by weight per gallon), add tap or de-ionized water to bring to 3784 mL. Let settle for 4–6 hours.

Formulation Coatings:

To 378.4 to 756.8 ml of the potassium sorbate concentrate, add 473.0 to 2838 ml of polyethylene glycol-8000 concentrate and bring to a total volume of 3784 ml with water. This is a ready-to-use coating solution, 5–10% in potassium sorbate and 5–40% in polyethylene glycol-8000.

Heat at 120° F. for best results. The drying time is determined by the concentration of polyethylene glycol-8000 and is usually between one hour to eight hours. Note: Keep ratio of potassium sorbate to polyethylene glycol-8000 at no less than 1:1 for stabilization.

6, The No-water Lubricant (Polyethylene Glycol 200–600 as Solvent):

Add 567.6 g to 946 g (15–25% by weight) of very finely ground potassium sorbate powder to 3216.4 ml polyethylene glycol 200–600 solution. Mix slowly for 24 hours. Filter out excess potassium sorbate.

Bring to a final volume of 3784 mL with polyethylene glycol 200–600 solution for use where water is prohibited (e.g., brake fluids, etc.). Heating at low temperatures (90–120° F.) helps the solution process. This solution can be used as a lubricant substitute, in a liquid or thickened state, as a substitute for greases and oils. The preparation can also be diluted 4:1 with tap or de-ionized water as desired for economic reasons and will still provide the same level of corrosion protection.

7 Powder Coating

1:1 Preparation

Mix 27.5 pounds polyethylene glycol powder (1450, 3350, 4000, 4600, 8000 series) with 27.5 pounds potassium sorbate powder. Blend well.

2:1 Preparation

Mix 36.67 pounds polyethylene glycol powder (1450, 3350, 4000, 4600, 8000 series) with 18.33 pounds potassium sorbate powder. Blend well.

This powder mixture can be used in as an anti-corrosion binder in a powder metallurgy process for coating metals. This process is particularly applicable to the automotive, aerospace and tool industries, for example.

8 Powder Mixing Formula.

Mix 189.2 g potassium sorbate (5% by weight, powder or granular) with 378.4 g polyethylene glycol (10% by weight, powder or granular). Add water to bring to one gallon (approx. 3405 ml of de-ionized or tap water). This solution can be used as previously described.

9 Alcohol Based Formula

Mix 90% by volume (3405.6 ml) ethyl alcohol or other alcohol (e.g., 190 proof) with 10% by volume (378.4 ml) of a liquid stock solution, 50% by weight potassium sorbate and 50% by weight polyethylene glycol-8000 to form a gallon.

This solution is particularly appropriate for, e.g., metal anti-corrosion protection in washing treatments and sterilization treatments, e.g., of medical instruments.

Use

In the experiments described herein, compositions according to the invention have been shown to prevent the corrosion of various ferrous samples, for example, various types of stainless steel, various types of low carbon steel, as well as cast iron, aluminum and other metals.

Thus, the compositions of the invention provide a superior level of corrosion protection and are, simultaneously, water-based, non-toxic and easily removed from the surface of a component for subsequent processing. No comparable product can perform to this level. Other coating systems, such as enamel paints, hard metallic coatings and heavy plastic coatings, require stripping for any subsequent processing and generate a hazardous waste product. The coating system according to the invention not only provides similar protection but also can be easily removed for subsequent processing without generating a hazardous waste.

The only comparable coating systems that are on the market today involve light oil treatments. These are generally put on steel bar and steel sheet products and then covered with paper or other laminates, which hold the oil in place. Most of these coatings do not fully protect the surface from corrosion, and, eventually, pitting and general surface corrosion occur. The light oil coating also has to be completely removed before subsequent processing, which requires the use of solvents and other cleaning chemicals. Additionally, as the light oil does not completely prevent corrosion, components generally have to be surface treated by grinding, machining or further chemical treatment. Besides the additional costs required to clean off the protective coating and treat the steel product, more hazardous wastes products are generated. A clear advantage of the corrosion protecting system of the invention is that it is completely removable by water rinsing and that the surface of a treated piece from which the coating has been removed can be further processed without surface treatment or machining.

Other applications of the novel coating systems include, gun lubricants, machining lubricants, and the protection of steel and ferrous products during shipment, particularly transoceanic transport, where products are exposed to salt water and high temperatures. The inventive coating systems have a substantial advantage in these applications. Further potential application of the coating system would be for steel products in the automotive industry, which is currently using galvanized steel. The corrosion protection system of the invention could practically eliminate the use of zinc coated steels for corrosion protection in automotive applications.

The various potential applications of the corrosion protection system of the invention might be categorized as follows:

(1) Complete Immersion Corrosion Protection—These applications would involve protection against corrosion and organic build up in closed loop water based systems such as water-cooling, heat exchangers and boilers. Ferrous, brass and aluminum based metals would benefit from the use of this product as the base for the liquid heat transport system. These applications range from automotive radiators to cooling water for nuclear reactors.

(2) Dip & Ship Applications—These applications involve the use of the corrosion protection system to prevent the corrosion of ferrous products during shipment.

(3) Lubrication—The system of the invention also lends itself to lubrication applications with the added benefit of not only providing corrosion protection but also being nontoxic. Potential applications include, e.g., food machinery and firearms lubricants and fluids for machining applications. Other applications might include any cutting operating that requires lubrication, ranging from the use of industrial blades to razor blades.

(4) Permanent Metal Coatings—The corrosion protection system according to the invention can be used as an undercoating, e.g., as a plating or a paint base, to provide substantial long-term protection in the harshest environments. Applications include use with automotive paints, electronic and computer component coatings and marine coatings. The coating can be applied as a liquid coating or by powder metallurgy processing.

Other more specific areas of use include wood processing, for termite control or reduction of brown mold; agricultural products, e.g., mixing a composition according to the invention with animal feeds, for mold prevention and odor reduction; medical and pharmaceutical, for rust inhibiting antiseptics; manufacturing of plastics, e.g., mixing a composition according to the invention into the premolded plastic to prevent oxidative degradation, and paper manufacturing, e.g., for paper whitening and for mold prevention and odor reduction.

While the present invention has been described in conjunction with a preferred embodiment, one of ordinary skill, after reading the foregoing specification, will be able to effect various changes, substitutions of equivalents, and other alterations to the compositions and methods set forth herein. It is therefore intended that the protection granted by Letters Patent hereon be limited only by the definitions contained in the appended claims and equivalents thereof.

What is claimed is:

1. A composition for preventing oxidative degradation of a substance, said composition comprising:
    an effective amount of an anti-corrosion agent, said agent comprising a 2,4-trans, trans-hexadiene moiety; and
    a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance and wherein said composition is packaged for delayed release.

2. The composition of claim 1, wherein said composition is encapsulated.

3. A method for preventing oxidative degradation of a substance, said method comprising the steps of:
    providing a composition comprising:
        an effective amount of an anti-corrosion agent, said agent comprising a 2,4-trans, trans-hexadiene moiety; and
    a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance; and
    applying said composition to a preparation of said substance, wherein said substance is a plastic material or a paper material.

4. A method for preventing oxidative degradation of a substance, said method comprising the steps of:
    providing a composition comprising:
        an effective amount of an anti-corrosion agent, said agent comprising a 2,4-trans, trans-hexadiene moiety; and
        a material capable of acting in conjunction with said anti-corrosion agent to prevent said oxidative degradation, wherein said material is selected from the group consisting of a polar liquid, a non-polar liquid, a viscous material, an organic liquid, a polymeric material arid a petroleum-based substance; and
    applying said composition to a preparation of said substance, wherein said applying step comprises using said composition as a lubricant for a surface of a metal.

5. A method for preventing oxidative degradation of a substance, said method comprising the steps of:
    providing a composition comprising:
        an effective amount of an anti-corrosion agent, said agent comprising a 2,4-trans, trans-hexadiene moiety; and
        a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance; and applying said composition to a preparation of said substance, wherein said applying step comprises using said composition as a pump oil or brake fluid.

6. A method for preventing oxidative corrosion of a metal, said method comprising the steps of:

providing a metal or a device containing a metal wherein said metal is susceptible to oxidative corrosion;

providing an anti-corrosion composition, said composition comprising an effective amount of an anti-corrosion agent, said agent comprising a 2,4-trans, trans-hexadiene moiety, said composition further comprising a material capable of forming a moisture retentive barrier over a surface of said metal, wherein said anti-corrosion agent and said material capable of forming a moisture retentive barrier over a surface of said metal are both provided in powdered form to produce a powdered composition; and applying said powdered composition to a surface of said metal by powder metallurgy processing, wherein said composition forms an anti-corrosive, moisture retentive barrier over said surface.

7. A method for preventing oxidative corrosion of a metal, said method comprising the steps of:

providing a metal or a device containing a metal wherein said metal is susceptible to oxidative corrosion;

providing an anti-corrosion composition, said composition comprising an effective amount of an anti-corrosion agent, said agent comprising a 2,4-trans, trans-hexadiene moiety, said composition further comprising a material capable of forming a moisture retentive barrier over a surface of said metal; and applying said composition to a surface of said metal, wherein said anti-corrosion agent in said composition is packaged for delayed release to form an anti-corrosive, moisture retentive barrier over said surface.

8. The method of claim 7, wherein said anti-corrosion agent is encapsulated.

9. A method for preventing oxidative corrosion of a metal, said method comprising the steps of:

providing a metal or a device containing a metal wherein said metal is susceptible to oxidative corrosion;

providing an anti-corrosion composition, said composition comprising an effective amount of an anti-corrosion agent, said agent comprising a 2,4-trans, trans-hexadiene moiety, said composition further comprising a material capable of forming a moisture retentive barrier over a surface of said metal;

applying said composition to a surface of said metal, wherein said composition forms an anti-corrosive, moisture retentive barrier over said surface; and applying a further coating layer over said surface.

10. The method of claim 9, wherein said further coating layer is applied by a process selected from the group consisting of painting, electro-plating and electro-polishing.

11. A method for preventing oxidative corrosion of a metal, said method comprising the steps of:

providing a metal or a device containing a metal wherein said metal is susceptible to oxidative corrosion;

providing an anti-corrosion composition, said composition comprising an effective amount of an anti-corrosion agent, said agent comprising a 2,4-trans, trans-hexadiene moiety, said composition further comprising a material capable of forming a moisture retentive barrier over a surface of said metal; and using said composition as a pump oil or brake fluid to apply said composition to a surface of said metal, wherein said composition forms an anti-corrosive, moisture retentive barrier over said surface.

12. A composition for preventing oxidative corrosion of a metal, said composition comprising:

an effective amount of an anti-corrosion agent, said agent comprising a 2,4-trans, trans-hexadiene moiety; and a material capable of forming a moisture retentive barrier over a surface of said metal, wherein said composition is powdered in final form and is capable of being applied to a surface of said metal by powder metallurgy processing.

13. A composition for preventing oxidative corrosion of a metal, said composition comprising:

an effective amount of an anti-corrosion agent packaged for delayed release, said agent comprising a 2,4-trans, trans-hexadiene moiety; and a material capable of forming a moisture retentive barrier over a surface of said metal.

14. The composition of claim 13, wherein said anti-corrosion agent is encapsulated.

15. A composition for preventing oxidative degradation of a substance, said composition comprising:

an effective amount of an anti-corrosion agent, said agent comprising a 2,4-trans, trans-hexadiene moiety; and a polymeric material capable of acting in conjunction with said anti-corrosion agent to prevent said oxidative degradation, wherein said polymeric material is a glycol.

16. A composition for preventing oxidative degradation of a substance, said composition comprising:

an effective amount of an anti-corrosion agent, said agent comprising a 2,4-trans, trans-hexadiene moiety; and a polymeric material capable of acting in conjunction with said anti-corrosion agent to prevent said oxidative degradation, wherein said polymeric material is a homo- or heteroglycan polymer.

17. The composition of claim 16, wherein said homo- or heteroglycan polymer is cellulose.

18. The composition of claim 16, wherein said homo- or heteroglycan polymer is a derivatized cellulose.

19. The composition of claim 18, wherein said derivatized cellulose is an hydroxyethylated or carboxymethylated starch or cellulose.

20. The composition of claim 16, wherein said 2,4-trans, trans-hexadiene moiety is potassium sorbate.

21. The composition of claim 15 or claim 16, wherein said anti-corrosion agent is packaged for delayed release.

22. The composition of claim 21, wherein said anti-corrosion agent is encapsulated.

23. The composition of claim 15 or claim 16, wherein said composition further comprises any one of an alcohol, a glycol, an antioxidant or an antimicrobial material.

24. A method for preventing oxidative degradation of a substance, said method comprising the steps of:

providing the composition of claim 15 or claim 16; and applying said composition to a preparation of said substance.

25. The method of claim 24, wherein said applying step comprises mixing said composition with a preparation of said substance.

26. The method of claim 24, wherein said substance is an agricultural product or a wood product.

27. The method of claim 24, wherein said substance is a plastic material or a paper material.

28. The method of claim 25, wherein said substance is a grain.

29. The method of claim 24, said method further comprising, following said applying step, the step of applying a further coating layer over said substance.

30. The method of claim 24, wherein said applying step comprises using said composition as a lubricant for a surface of a substance.

31. The method of claim 30, wherein said substance is a metal.

32. The method of claim 24, wherein said applying step comprises using said composition as a pump oil or brake fluid.

33. A method for preventing oxidative degradation of a substance, said method comprising the steps of:

provides a composition comprising:
an effective amount of an anti-corrosion agent, said agent comprising a 2,4-trans, trans-hexadiene moiety; and
a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance;

applying said composition to a preparation of said substance; and applying a further coating layer over said substance.

34. A method for preventing oxidative degradation of a substance, said method comprising the steps of:

providing a composition comprising:
an effective amount of an anti-corrosion agent, said agent comprising a 2,4-trans, trans-hexadiene moiety; and
a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance; and using said composition as a lubricant for a surface of a substance.

35. The method of claim 34, wherein said substance is a metal.

36. A method for preventing oxidative degradation of a substance, said method comprising the steps of:

providing a composition comprising:
an effective amount of an anti-corrosion agent, said agent comprising a 2,4-trans, trans-hexadiene moiety; and
a material capable of acting in conjunction with said anti-corrosion agent to prevent said oxidative degradation, wherein said material is selected from the group consisting of a polar liquid, a non-polar liquid, a viscous material, an organic liquid, a polymeric material and a petroleum-based substance; and using said composition as a pump oil or brake fluid within said substance.

* * * * *

UNITED STATES PATENT AND TRADEMARK OFFICE
CERTIFICATE OF CORRECTION

PATENT NO. : 6,833,087 B2 Page 1 of 1
APPLICATION NO. : 10/055799
DATED : December 21, 2004
INVENTOR(S) : Robert A. Beck et al.

It is certified that error appears in the above-identified patent and that said Letters Patent is hereby corrected as shown below:

Front Page, Title (54), "2,4,-HEXADIENOIC" should read --2,4-HEXADIENOIC--;

Column 3, line 44, "Ache" should read --the--;

Column 7, line 53, "produces" should read --products--;

Column 17, line 43, "by Product" should read --Byproduct--; and

Column 26, line 52 in claim 4, "arid" should read --and a--.

Signed and Sealed this

Fifteenth Day of August, 2006

JON W. DUDAS
*Director of the United States Patent and Trademark Office*